(12) United States Patent
Sinclair et al.

(10) Patent No.: US 8,604,443 B2
(45) Date of Patent: Dec. 10, 2013

(54) SYSTEM AND METHOD FOR MANIPULATING AN ION BEAM

(75) Inventors: Frank Sinclair, Quincy, MA (US); Victor M. Benveniste, Lyle, WA (US); Svetlana Radovanov, Marblehead, MA (US); James S. Buff, Brookline, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/944,537

(22) Filed: Nov. 11, 2010

(65) Prior Publication Data

US 2011/0114849 A1    May 19, 2011

Related U.S. Application Data

(60) Provisional application No. 61/260,988, filed on Nov. 13, 2009.

(51) Int. Cl.
    *H01J 1/50*    (2006.01)

(52) U.S. Cl.
    USPC .................................................. 250/396 ML

(58) Field of Classification Search
    USPC .............. 250/396 R, 396 ML, 397, 398, 400, 250/492.1, 492.2, 492.21, 492.23, 492.3
    See application file for complete search history.

(56) References Cited

U.S. PATENT DOCUMENTS

| | | | | |
|---|---|---|---|---|
| 3,541,328 A | * | 11/1970 | Enge | 250/396 R |
| 3,748,612 A | * | 7/1973 | Hashmi et al. | 335/210 |
| 5,132,544 A | * | 7/1992 | Glavish | 250/492.2 |
| 5,481,164 A | * | 1/1996 | Langner et al. | 315/370 |
| 5,736,743 A | | 4/1998 | Benveniste | |
| 5,834,786 A | * | 11/1998 | White et al. | 250/492.21 |
| 6,160,262 A | * | 12/2000 | Aoki et al. | 250/492.21 |
| 6,770,888 B1 | | 8/2004 | Benveniste et al. | |
| 6,933,507 B2 | | 8/2005 | Purser et al. | |
| 7,078,713 B2 | | 7/2006 | White | |
| 7,105,839 B2 | | 9/2006 | White | |
| 7,301,156 B2 | | 11/2007 | Purser et al. | |
| 7,351,984 B2 | | 4/2008 | Purser et al. | |
| 2004/0007679 A1 | * | 1/2004 | Viviani | 250/492.21 |
| 2006/0113493 A1 | * | 6/2006 | Kabasawa et al. | 250/492.21 |
| 2006/0169924 A1 | * | 8/2006 | Purser et al. | 250/492.21 |
| 2008/0230712 A1 | | 9/2008 | Chen | |

FOREIGN PATENT DOCUMENTS

JP    2008027845 A    2/2008

* cited by examiner

*Primary Examiner* — Robert Kim
*Assistant Examiner* — Jason McCormack

(57) ABSTRACT

A system for manipulating an ion beam having a principal axis includes an upper member having a first and a second coil generally disposed in different regions of the upper member and configured to conduct, independently of each other, a first and a second current, respectively. A lower member includes a third and a fourth coil that are generally disposed opposite to respective first and second coils and are configured to conduct, independently of each other, a third and a fourth current, respectively. A lens gap is defined between the upper and lower members, and configured to transmit the ion beam, wherein the first through fourth currents produce a 45 degree quadrupole field that exerts a rotational force on the ion beam about its principal axis.

13 Claims, 7 Drawing Sheets

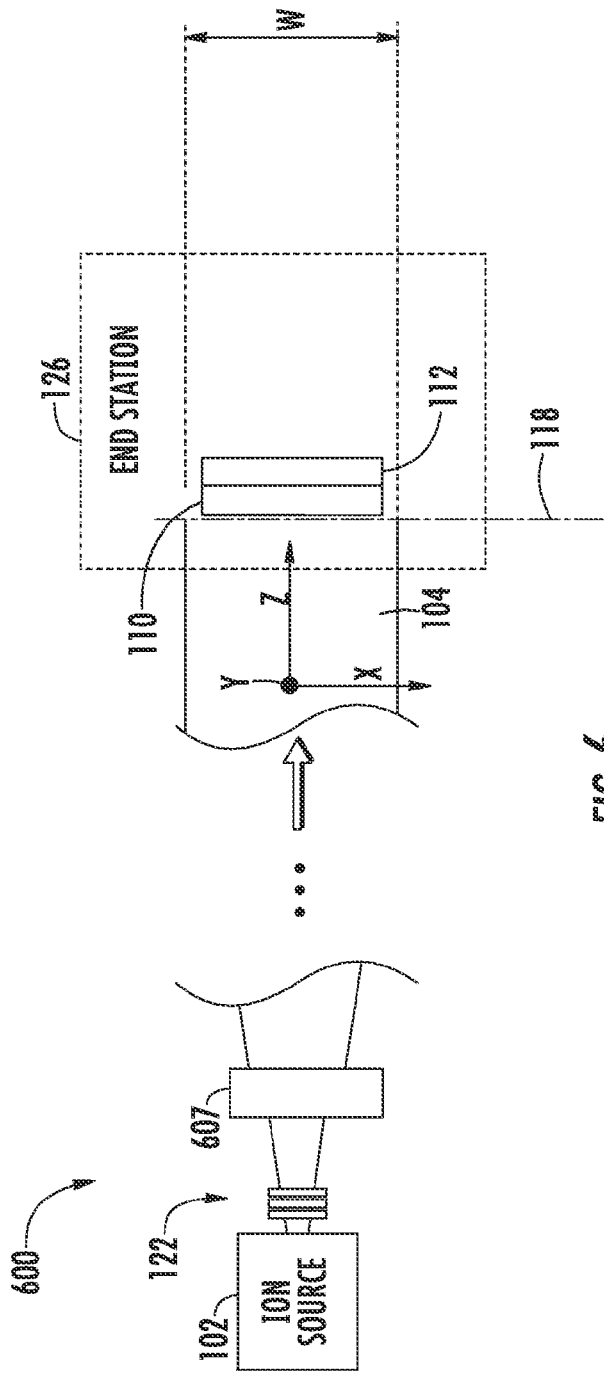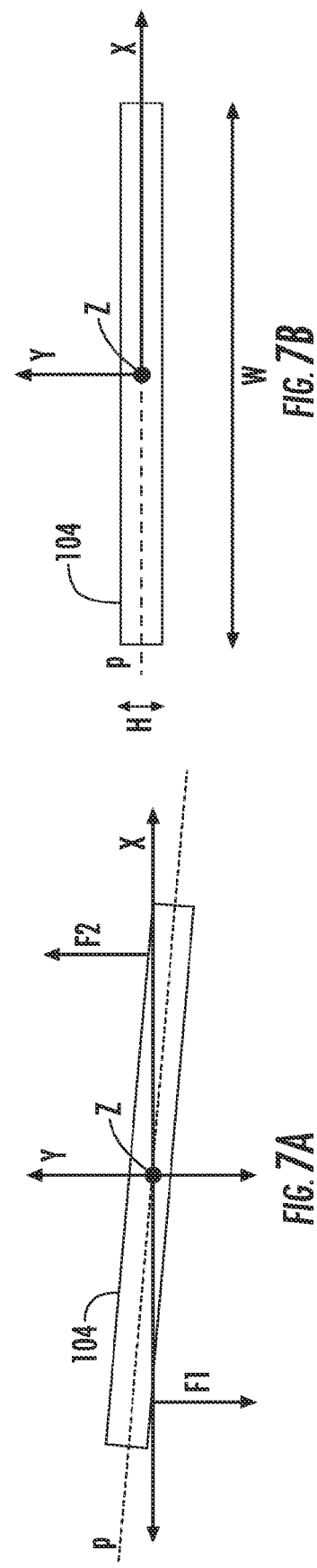

SYSTEM AND METHOD FOR MANIPULATING AN ION BEAM

This application claims the benefit of U.S. Provisional Patent Application No. 61/260,988, filed Nov. 13, 2009, which is incorporated by reference herein in its entirety.

FIELD

The present disclosure relates to ion beams. More particularly, the present disclosure relates to rotation of an ion ribbon beam within implantation systems.

BACKGROUND

A beamline ion implanter provides an ion beam for treating a workpiece. The ion beam may be a spot beam or ribbon beam and may be distributed across the front surface of the workpiece by ion beam movement, workpiece movement, or a combination of both. A spot beam has an approximately circular or elliptical cross section, while a ribbon beam has an approximately rectangular cross section.

Turning to FIG. 1, a plan view of a beamline ion implanter 100 providing a ribbon beam 104 for treating a workpiece 110 as is known in the prior art is illustrated. The beam line implanter 100 includes an ion source 102, an extraction electrode assembly 122, a quadrupole lens 124, other beamline components known to those skilled in the art (not illustrated), and an end station 126 having a platen 112 to support a workpiece 110 for treatment by the ribbon beam 104. The end station 126 also includes additional components known to those skilled in the art. For example, the end station 126 typically includes automated workpiece handling equipment. The entire path traversed by the ion beam is evacuated during ion implantation. The beamline ion implanter 100 may also have a controller (not illustrated) to control a variety of subsystems and components thereof. Before describing operation of the conventional beamline ion implanter 100, it is helpful to define a Cartesian coordinate system where a centroid of the ribbon beam 104 defines a Z axis. An X-Y plane defined by an X and Y axis is orthogonal to the Z axis as is shown by the coordinate system of FIG. 1, with X along the wide dimension of the ribbon beam, and Y across the thin dimension.

In operation, a plasma is formed in an ion source chamber of the ion source 102 from excitation of an input feed gas. The extraction electrode assembly 122 is positioned proximate an elongated extraction aperture of the ion source chamber and biased to extract ions from the same into the well defined ribbon beam 104. In this instance, the ribbon beam 104 has a width (W) in the X direction and a height (H) in the Y direction. The quadrupole lens 124 generates a quadrupole magnetic field in a gap through which the ribbon beam 104 passes to exert forces on the ion beam that expand the width of ion beam 104 in a horizontal plane (X-Z plane) and narrow the height of the ion beam in a vertical plane (Y-Z plane).

FIG. 2 is a perspective view of the conventional quadrupole lens 124 in more detail, while FIG. 3 is an end view sketch of the same quadrupole lens 124 when looking downstream in the Z direction or the direction of travel of the ribbon beam 104. The quadrupole lens 124 includes an upper magnetic core member 302 and a lower magnetic core member 304 spaced apart to form a gap 306 through which the ribbon beam 104 can pass. A plurality of coils may be wound along the upper and lower magnetic core members 302, 304. A left bucking coil 320, a center coil 322, and a right bucking coil 324 may be wound about the upper magnetic core member 302. Similarly, a left bucking coil 326, a center coil 328, and a right bucking coil 330 may be wound about the lower magnetic core member 304. The bucking coils keep the circulating flux in the magnetic circuit at 0, to avoid saturation, and prevent a long range dipole field from spreading to other regions where it would be undesirable. The direction of current flow in the coils is illustrated by the arrows in FIG. 2 and the symbols 340, 342 of FIG. 3. The boundary conditions proximate the gap 306 provide a quadrupole field that expands the width of the ribbon beam 104 in the horizontal plane (X-Z plane) and narrows the height of the ribbon beam 104 in the vertical plane (Y-Z plane) to provide the desired aspect ratio for the subsequent beamline. The direction of current flow in those portions 370, 372 of the center coils 322, 328 proximate the ribbon beam 104 is out of the page when viewed from the perspective of FIG. 3 looking downstream in the direction of travel of the ribbon beam.

The ribbon beam 104 may be manipulated by other beam line components (not illustrated) located downstream from the quadrupole lens 124 such as a mass analyzer, angle corrector, and a deceleration lens to name only several, before striking a workpiece 110. The front surface of the workpiece 110 supported by the platen 112 defines a workpiece plane 118. The workpiece 110 may include, but not be limited to, semiconductor wafers, flat panels, solar panels, and polymer substrates. The ribbon beam 104 at the workpiece plane 118 may have a width (W) equal to or greater than the workpiece 110. The platen 112 drives the workpiece in a direction (e.g., in the Y direction) orthogonal to the long dimension of the ribbon beam 104 to distribute the ribbon beam over an entirety of the workpiece 110.

Unfortunately, in the production of ribbon beams mechanical tolerances and other uncontrolled variations in electric or magnetic fields often produce undesirable variability in the profile of the ion beam as it proceeds along the beamline or as it impacts the workpiece. One of these variables may be referred to herein as a "roll" of the beam, that is, a rotation around the principal axis (or Z axis) of the beam. For example, FIG. 4 illustrates a cross sectional view of a ribbon beam 104 at the workpiece plane 118. Those skilled in the art will recognize that the cross sectional shape of the ribbon beam may be a generally irregular shape approximating that illustrated in FIG. 4. The ribbon beam 104 of FIG. 4 has rolled about the Z axis where the left side of the ribbon beam 104 has rotated upward as indicated by arrow 402 and the right side has rotated downward as indicated by arrow 404. FIG. 5 is a two dimensional profile of a ribbon beam illustrating another example of undesired roll aberration for an actual 400 eV boron ion beam. Similarly to FIG. 4, the ribbon beam of FIG. 5 has rolled upward on the left side of the ribbon beam and downward on the right side of the ribbon beam. Other undesired roll aberrations could also be in the opposite direction where the left side of the ribbon rotates downward and the right side rotates upward.

The drawbacks of such roll aberrations can include decreased transmission down the beamline as parts of the ribbon beam may inadvertently strike different portions of the beamline ion implanter. In addition, poor control of the incident angle at which the ribbon beam strikes the wafer can result. Accordingly, there is a need in the art for an apparatus and method to overcome the above-described inadequacies and shortcomings.

SUMMARY

In one embodiment of the present disclosure, a quadrupole lens is used to manipulate an ion beam having a principal axis.

The quadrupole lens includes an upper member having a first and a second coil that are generally disposed in different regions of the upper member and are configured to conduct, independently of each other, a first and a second current, respectively. The lens further includes a lower member having a third and a fourth coil that are generally disposed opposite to respective first and second coils and are configured to conduct, independently of each other, a third and a fourth current, respectively. The quadrupole lens also includes a lens gap that is defined between the upper and lower members and is configured to transmit the ion beam, wherein the first through fourth currents produce a 45 degree quadrupole field that exerts a rotational force on the ion beam about its principal axis.

In another embodiment, a method of controlling an ion beam in an ion implantation system using a quadrupole lens includes detecting a rotation of the ion beam about its principal axis in a first direction with respect to a desired plane and generating a set of forces orthogonal to the desired plane, wherein the set of forces rotate the ion beam in a second direction opposite the first direction.

BRIEF DESCRIPTION OF THE DRAWINGS

For a better understanding of the present disclosure, reference is made to the accompanying drawings, which are incorporated herein by reference and in which:

FIG. 6 is a plan view of a beamline ion implanter having a lens in accordance with an embodiment of the present disclosure;

FIG. 7A is a cross sectional view of a ribbon beam with a roll aberration;

FIG. 7B is a cross sectional view of an ideal ribbon beam with no roll aberration;

DETAILED DESCRIPTION

Figure 1:
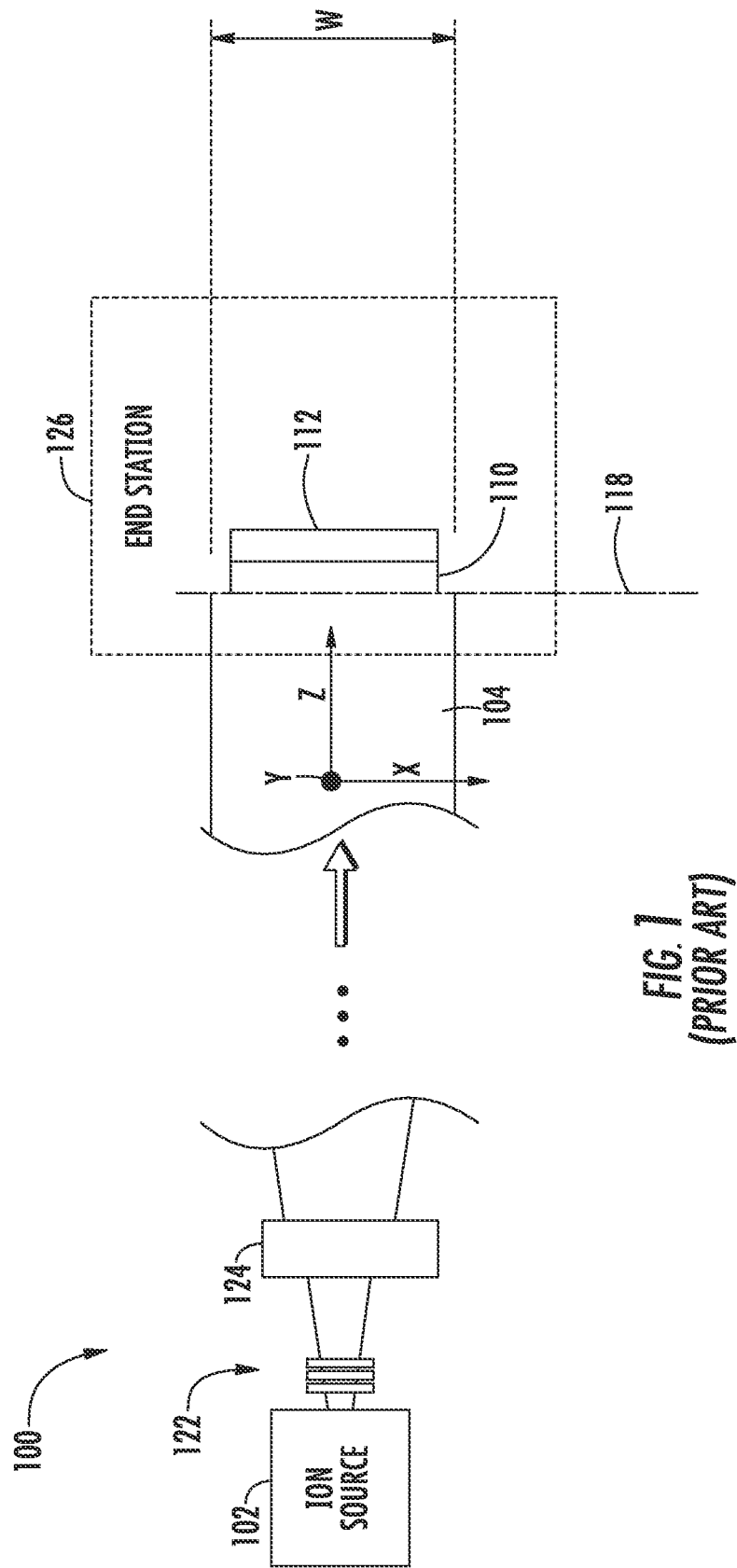
FIG. 1 is plan view of a prior art beamline ion implanter.
Figure 2:
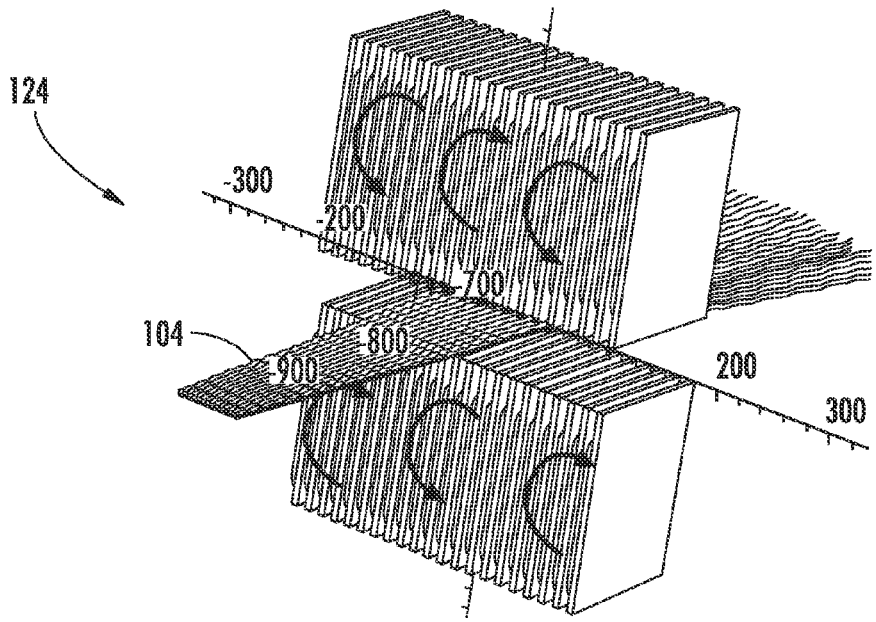
FIG. 2 is a perspective view of the prior art quadrupole lens of FIG. 1.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3:
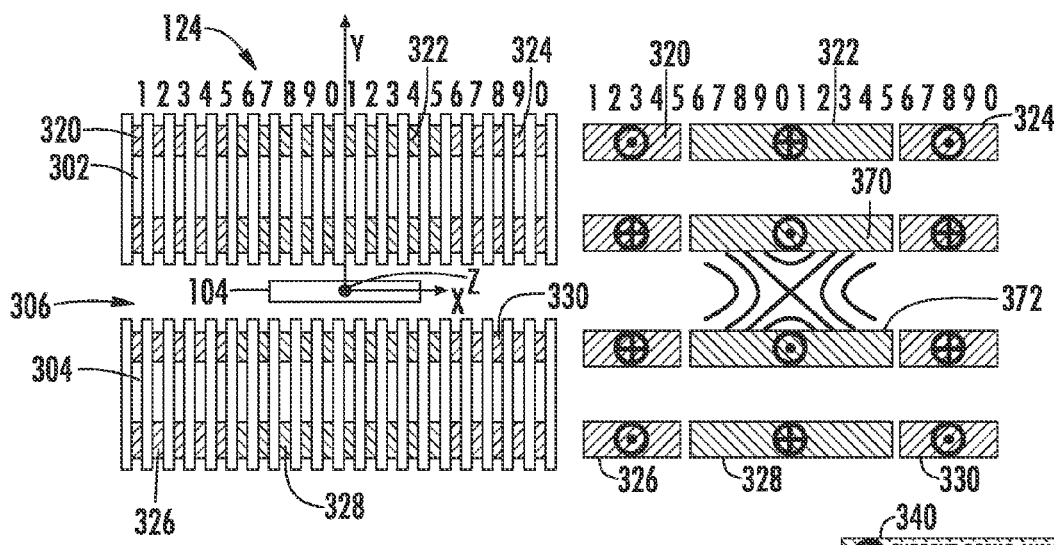
FIG. 3 is a schematic end view of the quadrupole lens of FIG. 2.
Figure 4:
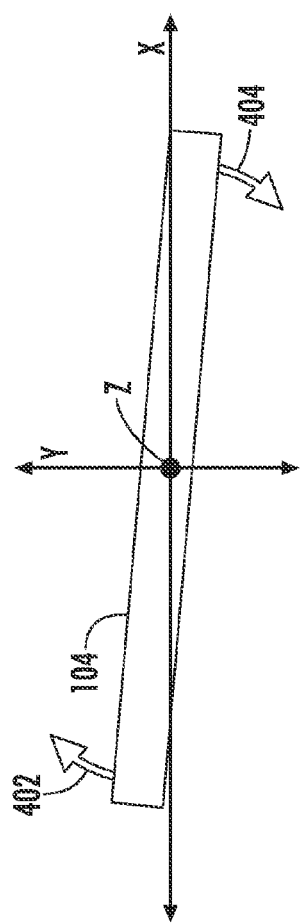
FIG. 4 is a cross sectional view of the ribbon beam of FIG. 1 illustrating a roll aberration.
Figure 5:
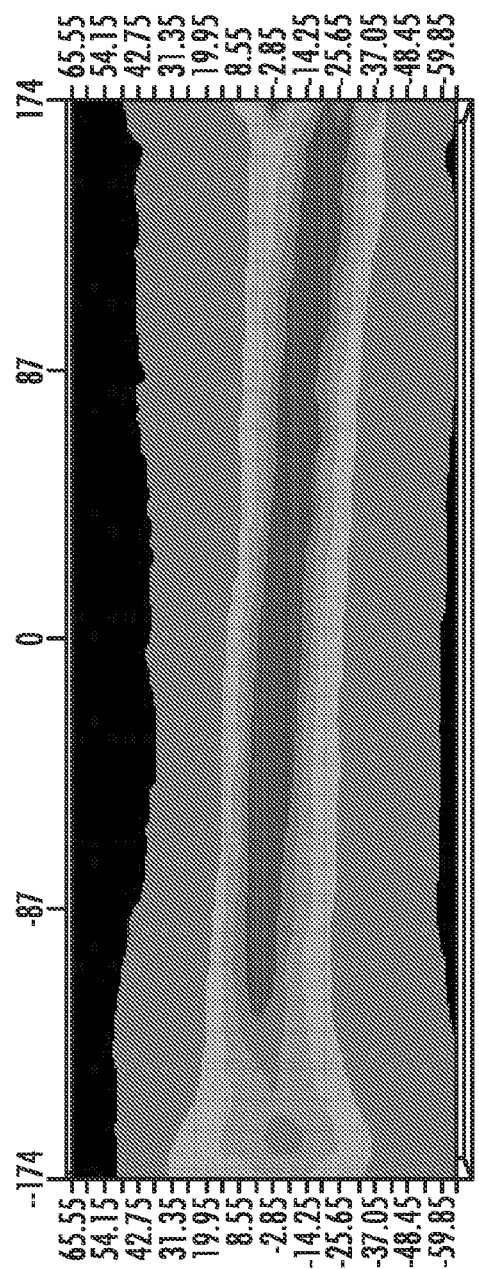
FIG. 5 is a cross sectional view of an actual ribbon beam illustrating a two dimensional profile of a ribbon beam with a roll aberration.

FIG. 6 is a plan view of a beamline ion implanter 600 having a lens 607 in accordance with an embodiment of the present invention. Other components of the ion implanter 600 similar to FIG. 1 are similarly labeled and hence any repetitive description is omitted herein. In general, the lens 607 may provide a force that is orthogonal to the desired plane of the ribbon beam to improve an unintended roll aberration. For example, FIG. 7A illustrates a cross sectional view of a ribbon beam (at the workpiece plane 118) similar to FIG. 5 that has suffered an unintended roll aberration. The roll aberration causes the plane p of the ribbon beam to be rotated slightly with respect to the X-Z plane shown, which may define a plane within the aperture of a quadrupole lens, as shown in FIG. 3. Such a roll aberration can be detected by two dimensional beam profile equipment (not illustrated) known in the art. In one instance, an angled shield positioned upstream of the lens may contain an array of beam sensors that be driven across the ribbon beam to block portions of the ribbon beam as it is driven. By analysis of signals from the array of sensors, a two dimensional profile of the ribbon beam can be obtained. Information, such as a two dimensional profile, may then be forwarded to a processor and/or controller of an ion implantation system that can send appropriate signals to adjust a quadrupole lens, such as lens 607. The signals may be sent to power supplies that are coupled to the lens to provide the appropriate currents that control operation of the lens, as described further below.

To correct for the detected roll aberration of FIG. 7A, the lens 607 may be configured to provide forces (F1) and (F2) orthogonal to a desired plane for the ribbon beam, e.g., the X-Z plane in the example of FIG. 7A. The forces (F1) and (F2) cause the ribbon beam to rotate to the left in this example so that the resulting ribbon beam at the workpiece plane approaches the ideal alignment, in which plane p aligns parallel to the X-Z plane, as illustrated in FIG. 7B. The direction of the forces (F1) and (F2) may also be reversed to cause the ribbon beam to rotate to the right to correct an opposite type of roll aberration. In the example of FIG. 7B, the long dimension or width (W) of the ribbon beam is along the X axis. Those skilled in the art will appreciate that ideal position of the width (W) of the ribbon beam may be in any direction. For example, the long dimension of the ribbon beam may be along the Y axis and the lens 607 would be repositioned accordingly to provide forces (F1) and (F2) orthogonal to the Y-Z plane.

In the embodiment of FIG. 6, the lens 607 is positioned immediately downstream from the extraction electrode assembly 122 in a direction of travel of the ribbon beam 104. At this position, the lens 607 is able to correct for unintended roll aberrations immediately after extraction to minimize unintended beam strike between the ribbon beam and any down stream components. Alternatively, the lens 607 may be positioned at other positions along the beamline in light of other considerations.

Turning to FIGS. 8a-e, one embodiment of the lens 607 is illustrated where a conventional quadrupole lens, such as lens 124 detailed earlier, is modified to also correct for unintended roll aberrations. The regions depicted in the views in FIGS. 8a-8e generally indicate the spatial distribution of current flows, which may be embodied in a single or multiple coils. Accordingly, portions, such as portion 808, may be referred to alternatively as a region or a coil. In either case, it is to be noted that the portions depicted in FIGS. 8a-8e only depict regions near the lens gap 306, and not entire coils.

Figure 8A:
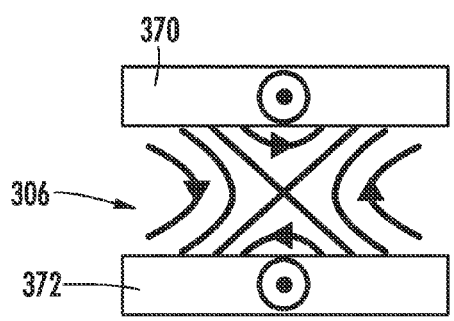
FIGS. 8a-8e are cross-sectional views showing spatial arrangements of electrical current, magnetic field and forces in an exemplary lens consistent with an embodiment of the present disclosure.
Figure 8B:
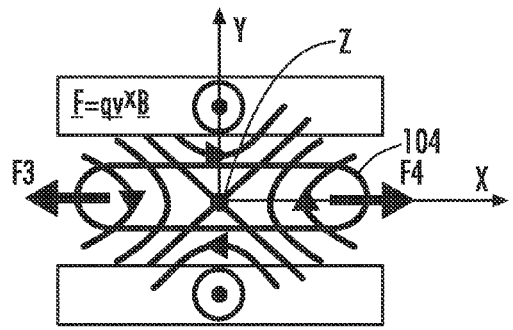

The view presented in FIGS. 8a-e is similar to the view of FIG. 3 in that a perspective looking downstream in the direction of travel of the ribbon beam 104 is provided. For clarity of illustration, only that portion of the center coils proximate the gap 306 is illustrated (the bucking coils and associated upper and lower magnetic core members are not illustrated). FIG. 8*a* illustrates the direction of electrical current in those portions 370, 372 of the center coils proximate the ribbon beam as earlier detailed in FIG. 3. The corresponding orthogonal quadrupole magnetic field creates the forces (F3) and (F4) acting to exert an outward force on the left and right extremities of the ribbon beam 104, as illustrated in FIG. 8*b*. In accordance with this embodiment, lens 607 may be configured to transmit currents, wherein forces F3 and F4 are comparable to those produced by the conventional lens 124 of FIG. 3.

Figure 8C:
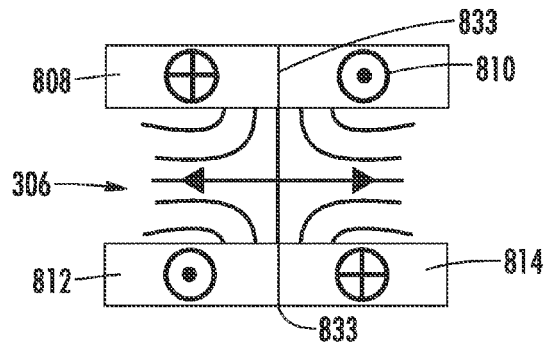
Figure 8D:
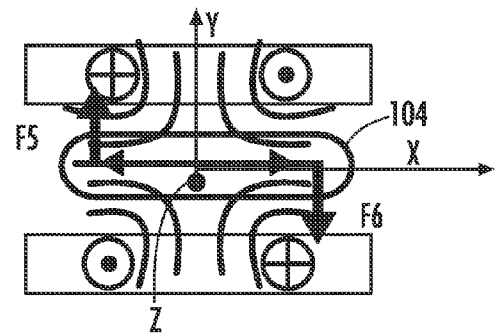

In addition, in this embodiment, lens 607 is configured to produce currents that tend to counteract ribbon beam roll aberrations. FIG. 8*c* illustrates additional roll aberration current flows that are also positioned proximate the ribbon beam. Upper left portion 808 may have a current flow directed into the page, while upper right portion 810 may have a current flow directed out of the page similar to that of view (a). Lower left portion 812 may have a current flow directed out of page, while lower right portion 814 may have a current flow directed into the page. The distribution of current flow shown in FIG. 8*c* acts to produce a quadrupole magnetic field in gap 306 that is rotated 45 degrees about the primary axis (also termed herein a "45 degree quadrupole field" or "45 degree quadrupole magnetic field"). FIG. 8*d* depicts the forces (F5) and (F6) that are created by the 45° quadrupole magnetic field lines when ribbon beam 104 passes through gap 306. The forces F5, F6 are orthogonal to the desired X-Z plane for the ribbon beam 104, which act to correct for a roll aberration where the left side of the ribbon beam has rotated downward and the right side has rotated upward. To correct for the opposite roll aberration, the direction of the forces (F5) and (F6) may be reversed by controlling the direction of current flow in portions 808, 810, 812, and 814.

Figure 8E:
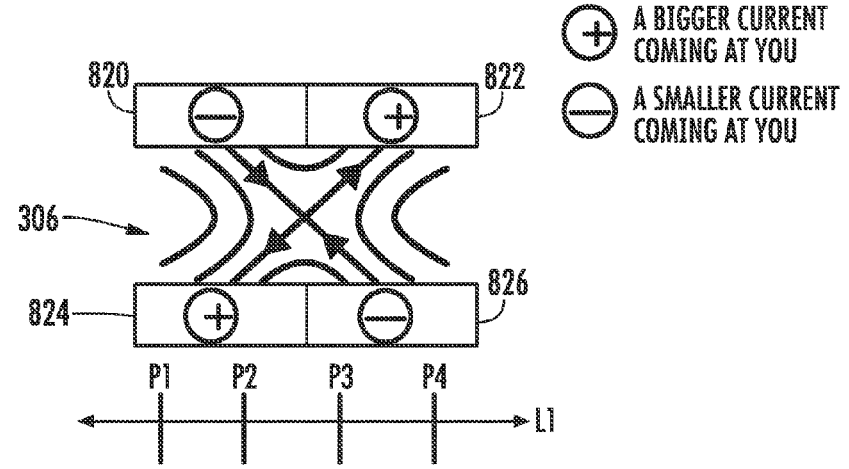

FIG. 8*e* represents the superposition of the currents of FIGS. 8*a* and 8*c*. In accordance with the present invention, currents depicted in FIGS. 8*a* and 8*c* can exist on one set of coil windings. In exemplary embodiments of the invention, the strength of the 45° quadrupole magnetic field may be on the order of 0.1 diopter, that is, about 0.05 diopters to about 0.2 diopters, and the strength of the orthogonal quadrupole magnetic field may be on the order of 2 diopters, that is, about 1-4 diopters. Since the strength typically required for roll correction of a ribbon beam is about 0.1 diopters and the strength of typical orthogonal quadrupoles is about 2 diopters, the amplitude of the currents used in coils to produce the fields depicted in FIGS. 8*c*, 8*d* are typically only about 10% of the amplitude of the currents used for coils that produce the currents of FIGS. 8*a*, 8*b*. Accordingly, compared to the current levels of FIG. 8*a*, the superposition of the currents of FIGS. 8*a* and 8*c* that is depicted in FIG. 8*e* results in a slightly smaller current directed out of the page on the upper left portion 820 and lower right portion 826, where the currents of FIG. 8*c* effectively subtract from the currents of FIG. 8*a*. In addition, the superposition also results in a slightly larger current directed out of the page on the upper right portion 822 and lower left portion 824, where the currents of FIG. 8*c* effectively add to the currents of view FIG. 8*a*.

Thus, the lens 607 may be embodied by a set of coils that produce a net current coming out of the page proximate the upper and lower boundaries of the lens gap 306, in which the current is slightly higher for one set of diagonally opposed portions 822, 824 than for the other set of diagonally opposed portions 820, 826. In one example, the spatial configuration of currents of FIG. 8*e* may be produced by six separate coils each disposed in a respective region corresponding to portions 370, 372 and 808-814. In this example, coils that produce the relatively larger orthogonal quadrupole fields of FIG. 8*a* (corresponding to portions 370, 372) may spatially overlap along the upper and lower cores with coils that produce the relatively smaller 45 degree quadrupole fields (corresponding to portions 808-814). In another example, the spatial configuration of currents of FIG. 8*e* may be produced by four separate coils each disposed in a respective region corresponding to portions 808-814.

Thus, a hallmark of the configuration of the invention in FIG. 8*e* is that the net current flow in the regions of the coils proximate the lens gap is in the same direction for all regions of the upper and lower members. This is true whether regions 820-826 each comprise a single coil or comprise multiple coils within a respective region. In the case of single-coil regions, the current in each coil flows in the same direction proximate the lens gap, as depicted in FIG. 8*e*. In the case where a given region, such as region 820, comprises multiple coils, the multiple coils may be configured to provide currents flowing in opposite directions as depicted in FIGS. 8*a* and 8*c*, (compare region, or coil, 808 to region, or coil 370). A net current flow results because the current amplitude in one coil is larger than that in the other. Moreover, in accordance with the embodiment of FIG. 8*e*, the direction of net current flow is the same in regions having opposed current flows (e.g., region 820) as in regions having parallel current flows (see, e.g., coils 370 and 810 of region 822).

In accordance with the present invention, during operation of an ion beam process, such as ion implantation, a two dimensional beam profile apparatus be employed to sense an unintended roll aberration, such as a roll to the left. In response, a controller (not illustrated) may control power supplies that provide current to the coils of FIGS. 8*a* and 8*c* to achieve a desired superposition of the two sets of currents, as illustrated in FIG. 8*e*, which provides the correct magnitude and direction of forces (F3), (F4), (F5), and (F6) to both expand the ribbon beam using forces (F3) and (F4), but more importantly to correct for any unintended roll aberration using forces (F5) and (F6). The direction of the forces (F5) and (F6) may be controlled by controlling the direction of current flow in the roll aberration correction coils of FIG. 8*c*. The magnitude of the forces (F5) and (F6) may be controlled by controlling the ratio of the amplitude of the current provided to center coils corresponding to portions 370, 372 compared to that in the roll aberration correction coils corresponding to portions 808-814.

Figure 9:
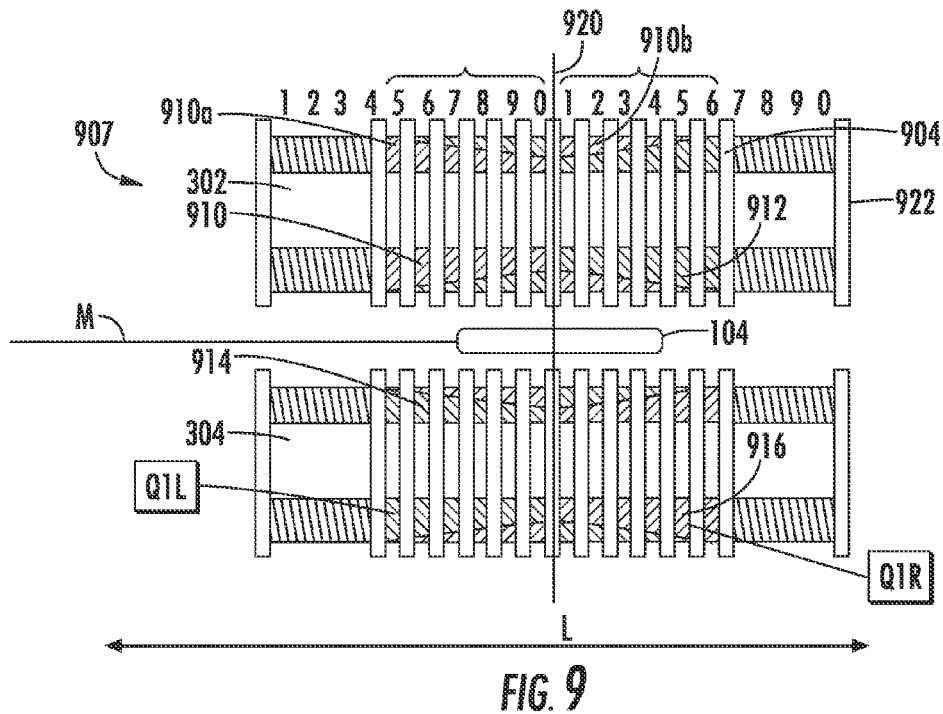
FIG. 9 is a view of another embodiment of a lens consistent with an embodiment of the present disclosure.

FIG. 9 is an end view of another embodiment of a lens 907 consistent with an embodiment of the invention. As opposed to the abrupt configuration of FIGS. 8*c*-8*e*, the coil configuration in FIG. 9 comprises a graded configuration. The term "graded configuration," as used herein, generally refers to a configuration of coils (which may be wrapped around a magnetic core) in which the current amplitude in the coils per unit length in a direction parallel to the magnetic core axis varies along the length of the core axis. In one example of a graded configuration, the amount of windings in a coil per unit length along the core axis (winding density) changes as a function of position along the core. In a graded configuration, the amount of windings per unit length may decrease in a monotonic fashion going from right to left or vice versa, and the windings may extend across a centerline of the lens, as discussed further below.

Referring also to FIG. 8*c*, compared to the abrupt change in current provided at the vertical center line 833 of the lens (and center of the beam), the embodiment of the invention shown in FIG. 9, where the coils have a graded configuration, produces a more gradual current change as a function of position going from left to right of centerline 920. This gradual current change is produced by using a variable number of turns in different parts of the coils used to produce the lens currents. The upper member of lens 907 includes upper left coil 910, upper right coil 912, while the lower member of lens 907 includes lower left coil 914 and lower right coil 916.

Notably, as schematically illustrated in FIG. 9, each of coils 910 to 916 extends across the centerline of lens 907. For example, from the standpoint of FIG. 9, coil 910 is disposed predominantly in the left portion of the upper member 922 around core 302, but also extends into the right portion of the upper member. However, as indicated by the smaller shaded area, the number of windings of coil 910 is significantly lower on the right portion 910b, as opposed to the left portion 910a. The number of windings of coil 910, (that is, the number of windings per unit length along the direction L) may decrease from right to left in both the upper left and upper right regions, as suggested by FIG. 9. As further illustrated in FIG. 9, coil 912 may be graded in a similar, but opposite, manner to coil 910. In other words, coil 912 also extends across center line 920, but the windings increase in number (number per unit length) as a function of position along L from left to right. Coils 914 and 916, disposed on lower core 304, may be graded in a manner similar to that of coils 910, 912.

In one embodiment, the fins in the bucking coil regions may be removed, while the fins 904 in the center portion may remain. The extra space may be used to maintain the same number of turns in the bucking coils (not shown) as in the graded quadrupole coils. In another embodiment, depicted in FIG. 9, the region where the coils 910-916 are disposed may be lengthened compared to known lenses; for example, to a region encompassing six fins from the center, while maintaining the fin spacing (see the five fin configuration of conventional lens 124 in FIG. 3).

In accordance with the present invention, lens 907 provides independent adjustment of both orthogonal and 45 degree quadrupole fields. As further illustrated in FIG. 9, the dark windings, corresponding to coils 912 and 914, may be driven by one power supply (Q1L) while the light windings, corresponding to coils 910 and 916, may be driven by another power supply (Q1R). By adjusting both power supplies together, it is possible to adjust the strength of the orthogonal quadrupole. By adjusting the ratio of current provided by both power supplies (Q1L) and (Q1R) it is possible to change the 45 degree quadrupole field to correct for roll aberration of beam 104.

Figure 10:
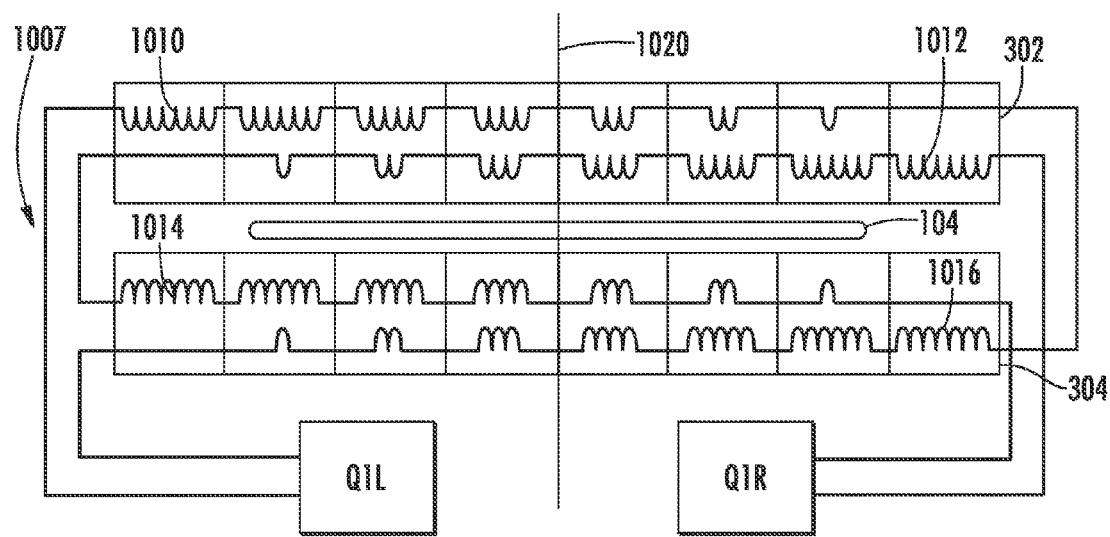
FIG. 10 is a graphical illustration of a lens consistent with FIG. 9.

FIG. 10 is another depiction of a lens 1007 consistent with that of FIG. 9 that can produce the superimposed effects of an orthogonal quadrupole and a rotated quadrupole. The diagram of FIG. 10 omits display of the bucking coils. Similarly to lens 907, lens 1007 provides a series of graded coils 1010, 1012, 1014, and 1016, which are each disposed predominantly in a respective quadrant of lens 1007. However, as with coils 910-916, the windings in each of coils 1010-1016 extend across the centerline 1020. Upper left coil 1010 and lower right coil 1016 are powered by supply Q1L, while upper right coil 1012 and lower left coil 1014 are powered by supply Q1R.

When operated with a different current provided by power supply Q1L as opposed to that provided by power supply Q1R, the lens 1007 produces a 45 degree quadrupole field that induces forces at right angles to the desired plane (e.g., the X-Z plane) of the ribbon beam 104 and can thus correct for unintended roll aberration. Lens 1007 may also be configured to produce an orthogonal quadrupole field by operating as described above generally with respect to FIGS. 8a-8e. Thus, in one example, each of coils 1010-1016 may transmit a current that is coming out of the page in the region proximate the ion beam, while the current from Q1R, which powers coils 812, 814, is slightly larger than that transmitted by coils 810, 816, which are powered by Q1L.

The graded coil configuration provides a gradual change in current density between the left and right sides of lens 1007, rather than an abrupt change in current density at the centerline 1020. This can produce a more linear beam displacement behavior as detailed below with respect to FIG. 11.

One common feature of both the graded (FIGS. 9 and 10) and abrupt (FIGS. 8c-8e) configurations of the quadrupole lenses of the present invention is that the current density (amplitude) proximate the lens gap can be made asymmetric with respect to a lens midplane M (see FIG. 9) that lies in the lens gap between top and bottom portions and is parallel to their axes. For example, a net difference in current exists between opposed respective upper and lower portions 820 and 824, and also between portions 822 and 826 in the lens embodiment of FIG. 8e. At lateral positions P1 and P2 along direction L1, the current density is higher in lower portion 824 as compared to upper portion 820, while at lateral positions P3 and P4, the current density is lesser in lower portion 826 as compared to upper portion 822. This net difference in current density between top and bottom portions at different points along direction L1 allows the development of a rotated quadrupole field that produces forces at right angles to the plane of the ion beam 104, such as forces F5 and F6, which, in turn, gives rise to a rotation of the passing beam 104 that can correct for roll aberrations.

Moreover, the present invention provides means to produce and ensure that the rotated quadrupole field is symmetric. In addition to the top-to-bottom asymmetry discussed above, embodiments of this invention provide a diagonal symmetry of current (that is, a 180 degree rotational symmetry generally about the principal axis of the ion beam) to provide a uniformly distributed rotated field. In particular, current may be supplied from a common power supply to each of two sets of diagonally opposed pairs of coils (see, e.g. coil pairs 808, 814 and 810, 812). Moreover, each of the coils may be designed similarly. Thus, when powered by a common supply, the current distribution in a first coil of a first diagonal pair is matched by that of the other coil of the pair. Similarly, the current distribution in a first coil of a second diagonal pair is matched by that of the other coil of the pair. This helps ensure that the current distribution from left to right along the upper member of a quadrupole lens is matched by the current distribution from right to left along the lower member of the quadrupole lens, thereby producing a symmetrically rotated quadrupole field. Accordingly, the forces from the symmetric rotated quadrupole field acting on a passing ion beam 104 produce a uniform rotation in which the shape of the beam is maintained to first order across its width.

Figure 11:
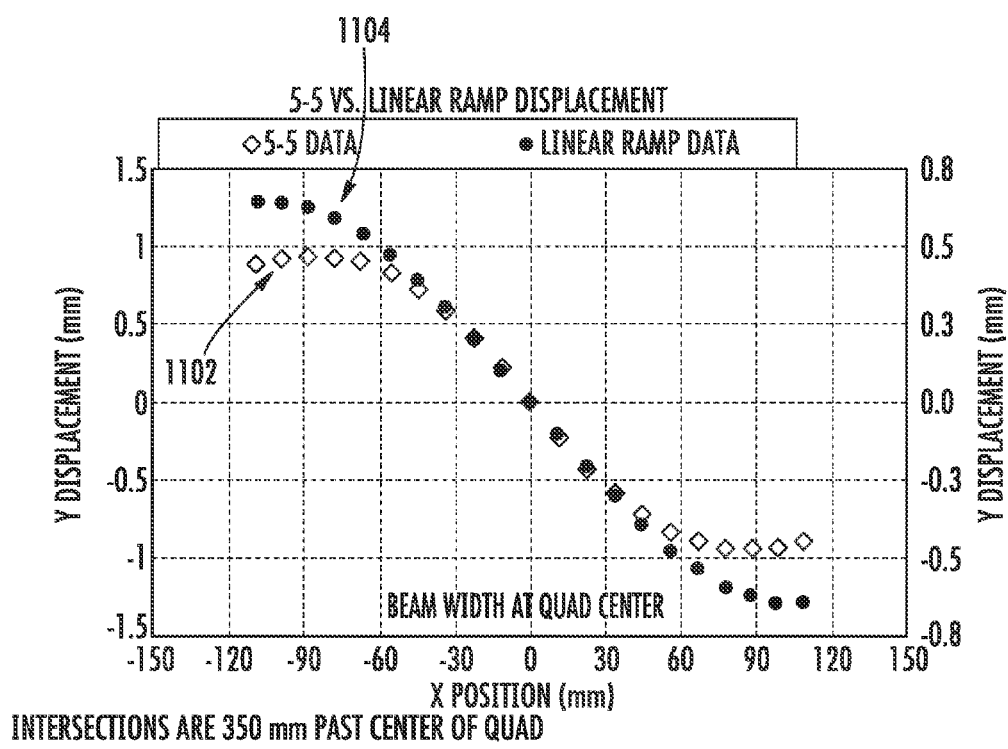
FIG. 11 is a chart showing the results of beam simulation for the embodiments of FIGS. 8 and 9.

FIG. 11 is a chart that presents simulation results contrasting the embodiment of FIG. 8 with FIG. 9. The squares 1102 plot the results of the design of FIG. 8, which has an abrupt step in the current density between right and left portions of the lens, while the dots 1104 illustrate the output of the graded coil embodiment of FIG. 9 in which the number of windings for power supply Q1L is varied linearly downward as the windings for Q1R vary linearly upwards between right and left portions across the width of the ribbon beam, as illustrated in FIG. 9. Although both embodiments are effective for roll aberration correction, the plot of dots 1104 illustrates that a comparatively more linear displacement behavior results from the graded coil configuration.

There has thus been provided a lens architecture with current components going in opposite directions above and below the ribbon beam to allow the development of forces at right angles to the desired plane of the ribbon beam. By also varying the total current density from the left to right on the top and similarly from right to left on the bottom, the average direction of the ribbon beam may not be altered while the edges may be rotated to provide for a desired correction to an unintended roll aberration. In addition, two independently adjustable quadrupoles within a single lens element are provided. In other words, an electrical means for controlling the principal angle of a resulting quadrupole is provided by providing two independently adjustable quadrupoles whose sum is the resulting quadrupole, wherein the principle angle varies according to the ratio of the two independently adjustable quadrupoles. Furthermore, a design is provided that allows for the linearity of the correction to the ribbon beam to be optimized by adjusting the number of turns as a function of lateral position of successive coils of the lens. Corrections to unintended roll aberrations may be made during a tuning procedure to facilitate alignment of the ribbon beam with apertures and components in the beamline. A reduction in variation of the implant angle in the vertical direction across the width of the wafer can also be achieved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for controlling rotation of a ribbon beam in an ion implanter, comprising:
    a detector for measuring a beam profile of the ribbon beam, the ribbon beam comprising a principal axis defined by a centroid of the ribbon beam in a direction of travel of the ribbon beam and a planar axis perpendicular to the principal axis;
    a controller for receiving beam profile information from the detector and for sending control signals to control first and second output currents; and
    a quadrupole lens comprising:
        an upper member having a first and a second coil that are generally disposed in respective first and second regions of the upper member and are configured to conduct, independently of one another, a first and a second current, respectively; and
        a lower member having a third and a fourth coil that are generally disposed in respective third and fourth regions opposite to respective first and second coils of the upper member and are configured to conduct, independently of one another, a third and a fourth current, respectively;
        and a lens gap defined between the upper and lower members configured to transmit the ribbon beam, such that the first through fourth currents produce a 45 degree quadrupole field to exert a rotational force on the ribbon beam about its principal axis.

2. The system of claim 1, wherein the first through fourth regions proximate the lens gap have an associated net current that flows in a common direction with respect to the principal axis, the system configured to independently vary the first and second output currents such that a ratio of net current in the first and fourth regions to net current in the second and third regions varies according to the control signals.

3. The system of claim 1, wherein the quadrupole lens further comprises:
    an upper center coil disposed along the upper member; and
    a lower center coil disposed along the lower member, the upper center coil and bottom lower center coil configured to produce currents traveling in a common direction proximate to the lens gap so as to produce an orthogonal quadrupole field, wherein a magnitude of the 45 degree quadrupole field is controlled by a ratio of amplitude of currents in the upper and lower center coils to that in the first through fourth coils.

4. The system of claim 1, wherein the first and fourth coils are configured to receive a first common current such that current in regions of the first and fourth coils proximate the lens gap follows a first direction, the second and third coils are configured to receive a second common current such that current in regions of the second and third coils proximate the lens gap follows a second direction opposite the first direction, wherein a direction of rotation of the ribbon beam about its principal axis is reversible by switching directions of the first and second common currents.

5. The system of claim 1, wherein the first and fourth coils are configured to receive a first common current, and the third and second coils are configured to receive a second common current such that current in regions of the first through fourth coils proximate the lens gap follows a first direction with respect to the principal axis.

6. The system of claim 5 wherein when the first common current is larger than the second common current the 45 degree quadrupole field acts to rotate the ribbon beam about its principal axis in a first direction.

7. The system of claim 6 wherein when the first common current is smaller than the second common current the 45 degree quadrupole field acts to rotate the ribbon beam in a second direction opposite the first direction.

8. The system of claim 1, wherein the upper member has a first half and a second half and the lower member has a first half and a second half, each of the first and second coils disposed only in the first and second half respectively of the upper member and the third and fourth coils disposed only in the first and second half respectively of the lower member, such that when the first output current differs in amplitude from the second output current, an abrupt change in net current amplitude occurs between respective halves of the upper and lower members.

9. The system of claim 1, wherein each of the first through fourth coils is arranged in a graded configuration.

10. The system of claim 9 wherein, when the first output current is different in amplitude from that of the second output current, a gradual change in current amplitude occurs between respective regions of the upper and lower members.

11. The system of claim 1, wherein a magnitude of an orthogonal quadrupole field is varied by increasing or decreasing in concert the first and second output currents, and wherein a magnitude of the 45 degree quadrupole field is varied by varying a ratio of the first and second output currents.

12. The system of claim 1, wherein the upper member has an elongated shape defining an upper axis and wherein the lower member has an elongated shape defining a lower axis, the lower axis parallel to the upper axis, and wherein the lens gap has a desired plane of travel for the ribbon beam that is parallel to the upper axis and the lower axis, and wherein the 45 degree quadrupole field is configured to generate a first force orthogonal to the desired plane acting on one end of the ribbon beam and a second force having a direction opposite to the first force acting on an opposing end of the ribbon beam, the second force also orthogonal to the desired plane, wherein the first force and the second force exert the rotational force on the ribbon beam about its principal axis.

13. The system of claim 1, wherein the upper member has an elongated shape defining an upper axis and wherein the lower member has an elongated shape defining a lower axis, the lower axis parallel to the upper axis, and wherein the lens gap has a desired plane of travel for the ribbon beam that is parallel to the upper axis and the lower axis, and wherein the 45 degree quadrupole field is configured to generate a force orthogonal to the desired plane to exert the rotational force on the ribbon beam about its principal axis.

* * * * *